(12) United States Patent
Wang et al.

(10) Patent No.: US 12,388,466 B2
(45) Date of Patent: Aug. 12, 2025

(54) METHOD AND APPARATUS FOR TESTING ERROR CORRECTING CODE (ECC) FUNCTION OF FPGA ON-CHIP BLOCK RANDOM ACCESS MEMORY (BRAM)

(71) Applicant: GOWIN Semiconductor Corporation, GuangZhou (CN)

(72) Inventors: Jingxiang Wang, GuangZhou (CN); Yue Han, GuangZhou (CN); Zheng Wang, GuangZhou (CN); Yunjie Fan, GuangZhou (CN); Tianping Wang, GuangZhou (CN); Niu Li, GuangZhou (CN); Qi Zhou, GuangZhou (CN)

(73) Assignee: GOWIN Semiconductor Corporation, Ltd., GuangZhou (CN)

( * ) Notice: Subject to any disclaimer, the term of this patent is extended or adjusted under 35 U.S.C. 154(b) by 0 days.

(21) Appl. No.: 18/438,380

(22) Filed: Feb. 9, 2024

(65) Prior Publication Data
US 2024/0275406 A1    Aug. 15, 2024

(51) Int. Cl.
*H03M 13/01* (2006.01)
*G11C 29/08* (2006.01)
(52) U.S. Cl.
CPC ........... *H03M 13/015* (2013.01); *G11C 29/08* (2013.01)

(58) Field of Classification Search
CPC .................................................. H03M 13/015
See application file for complete search history.

(56) References Cited

U.S. PATENT DOCUMENTS 4,477,882 A * 10/1984 Schumacher ........ G05B 19/052
709/251

* cited by examiner

*Primary Examiner* — Joseph D Torres
(74) *Attorney, Agent, or Firm* — JW Law Group; James M. Wu

(57) ABSTRACT

A system and method for testing Error Correcting Code ("ECC") function of Field Programmable Gate Array ("FPGA") on-chip block random access memory ("BRAM") includes control modules, at least two BRAMs with ECC function and sequentially connected to form a ring, and parity bit comparison modules corresponding to each BRAM. Each parity bit comparison module is connected to its corresponding BRAM and the next adjacent BRAM. The control module is used to send data read and write test instructions to each BRAM. Each BRAM is used to read test data sequentially, write test data into next adjacent BRAM whenever the test data is read, and send the first parity bit generated during reading to the corresponding parity bit comparison module. Each parity bit comparison module is used to compare the first and second parity bits, where the second parity bit is generated during the writing of test data. The embodiments of the present invention reduce the required test stimuli and the interactions with upper computer ports, which enhances the test efficiency.

12 Claims, 6 Drawing Sheets

METHOD AND APPARATUS FOR TESTING ERROR CORRECTING CODE (ECC) FUNCTION OF FPGA ON-CHIP BLOCK RANDOM ACCESS MEMORY (BRAM)

PRIORITY

This application claims the benefit of priority of an earlier filed Chinese patent application Ser. No. 202310115430.7, filed on Feb. 14, 2023 with China National Intellectual Property Administration of the People's Republic of China, entitled "A Method for Testing ECC Function of FPGA on-chip BRAM," the disclosure of which is hereby incorporated by reference.

FIELD

The exemplary embodiment(s) of the present application relates to integrated circuit ("IC") field technology, especially a system and method for testing Error Correcting Code ("ECC") function of Field Programmable Gate Array ("FPGA") on-chip block random access memory ("BRAM").

BACKGROUND

ECC is a data error correction technique that utilizes redundant information bits to protect data. Adding ECC function to a storage unit can enhance the reliability of the memory. However, ECC itself is a logic circuit, and may fail during manufacturing process. Therefore, a method is needed to test whether the ECC function is correct.

Existing techniques often require testing BRAM with ECC function separately, and thus require a large number of test stimuli and frequent interactions with the upper computer port when there are a large number of BRAMs, and thus the test is very inefficient.

SUMMARY

The present application discloses a system and method for testing ECC function of FPGA on-chip BRAM. The test of BRAM with ECC function can be realized by utilizing the internal logic of the FPGA and the data preset in the BRAM. This significantly reduces the required test stimuli and the frequent interactions with the upper computer port, thereby greatly improving the test efficiency.

In one aspect, the present application discloses a system for testing ECC function of FPGA on-chip BRAM, wherein the system includes control modules, at least two BRAMs with ECC function, and parity bit comparison modules corresponding to each BRAM. At least two BRAMs are sequentially connected to form a ring connection structure. Each parity bit comparison module is connected to its corresponding BRAM and the next adjacent BRAM, wherein, the control module is used to send data read and write test instructions to each BRAM.

Each BRAM is used to sequentially read test data preset in each memory address in itself according to the data read and write test instruction, write the test data into the corresponding memory address of the next BRAM adjacent to the BRAM itself whenever the test data in the memory address is read, and send the first parity bit generated during reading the test data to the parity bit comparison module corresponding to the BRAM.

Each parity bit comparison module is used to obtain the first parity bit generated when the BRAM corresponding to itself reads test data and a second parity bit generated when the next adjacent BRAM writes test data, and compares whether the first parity bit is the same as the second parity bit.

In another aspect, the present application discloses a method for testing ECC function of FPGA on-chip BRAM, wherein the system includes: Control module sends data read and write test instructions to each BRAM.

Each BRAM sequentially reads test data preset in each memory address in the BRAM according to the data read and write test instruction, write the test data into the corresponding memory address of the next BRAM adjacent to the BRAM itself whenever the test data in the memory address is read, and send the first parity bit generated during reading the test data to the parity bit comparison module corresponding to the BRAM.

Each parity bit comparison module is used to obtain the first parity bit generated when the BRAM corresponding to itself reads test data and a second parity bit generated when the next adjacent BRAM writes test data, and compares whether the first parity bit is the same as the second parity bit.

Compared with the relevant techniques, in the present application, each BRAM sequentially reads test data preset in each memory address in the BRAM according to the data read and write test instruction, write the test data into the corresponding memory address of the next BRAM adjacent to the BRAM itself whenever the test data in the memory address is read, and send the first parity bit generated during reading the test data to the parity bit comparison module corresponding to the BRAM itself, so that each parity bit comparison module obtains the first parity bit generated when the BRAM corresponding to itself reads the test data, and the second parity bit generated when the next adjacent BRAM writes the test data, then compares the above parity bits. This realizes the test of the read and write function of the BRAM with ECC function by directly utilizing the preset data in the BRAM without the aid of an external storage device, thereby greatly simplifying the test process.

Additional features and benefits of the exemplary embodiment(s) of the present application will become apparent from the detailed description, figures, and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
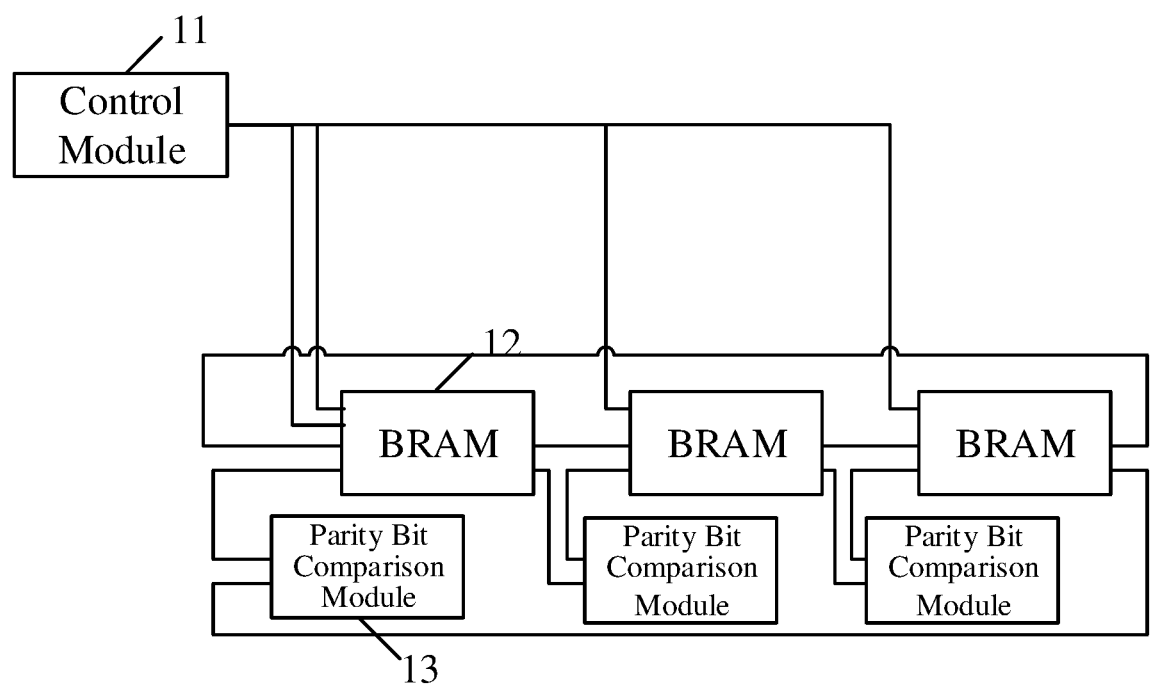
FIG. 1 is a block diagram illustrating a system capable of testing Error Correcting Code ("ECC") function of Field Programmable Gate Array ("FPGA") on-chip BRAM.

Embodiments of the present invention disclose a system and method for testing Error Correcting Code ("ECC") function of Field Programmable Gate Array ("FPGA") on-chip BRAM. The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description. In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts. In accordance with the embodiment(s) of present invention, the components, process steps, and/or data structures described herein may be implemented using various types of operating systems, computing platforms, computer programs, and/or general-purpose machines. In addition, those of ordinary skills in the art will recognize that devices of a less general purpose nature, such as hardware devices, FPGA, application specific integrated circuits ("ASIC"), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory. The term "system" or "device" is used generically herein to describe any number of components, elements, sub-systems, devices, packet switch elements, packet switches, access switches, routers, networks, computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

Embodiments of the present application disclose a system for testing ECC function of FPGA on-chip BRAM, wherein the system includes control module 11, at least two BRAMs 12 with ECC function, and parity bit comparison modules 13 corresponding to each BRAM. At least two BRAMs 12 are sequentially connected to form a ring connection structure. Each parity bit comparison module 13 is connected to its corresponding BRAM 12 and the next adjacent BRAM 12; wherein, the control module 11 is used to send data read and write test instructions to each BRAM 12.

Each BRAM 12 sequentially reads test data preset in each memory address in the BRAM according to the data read and write test instruction 12, write the test data into the corresponding memory address of the next BRAM 12 adjacent to the BRAM itself whenever the test data in the memory address is read, and send the first parity bit generated during reading the test data to the parity bit comparison module 13 corresponding to the BRAM.

Each parity bit comparison module 13 is used to obtain the first parity bit generated when the BRAM corresponding to itself reads test data and a second parity bit generated when the next adjacent BRAM writes test data, and compares whether the first parity bit is the same as the second parity bit.

For example, writing the test data read to the corresponding memory address of the next BRAM adjacent to the BRAM itself implies that the location of the memory address where the test data read is located in the current BRAM is the memory address where the test data read is located in the next BRAM, e.g., if the test data read is at the third memory address in the current BRAM, the location where the test data read is stored in the next BRAM is the third memory address of the next BRAM.

For example, each BRAM reads 1 test data at the same time, assuming that there are 3 BRAMs, the test data of the first memory address of the first BRAM is read and written to the first memory address of the second BRAM, the test data of the first memory address of the second BRAM is read and written to the first memory address of the third BRAM, the test data of the first memory address of the third BRAM is read and written to the first memory address of the first BRAM, this process is called 1 cycle. Then, the test data of the second memory address of the first BRAM is read and written to the second memory address of the second BRAM, the test data of the second memory address of the second BRAM is read and written to the second memory address of the third BRAM, and the test data of the second memory address of the third BRAM is read and written to the second memory address of the first BRAM. . . . Until all the test data of the memory address of the first BRAM is written to all the memory addresses of the second BRAM, all the test data of the memory address of the second BRAM is written to all the memory addresses of the third BRAM, all the test data of the memory address of the third BRAM is written to all the memory addresses of the first BRAM, then loop the whole process above.

For example, parity bits are generated each time the test data is read and written.

Embodiments of the present application disclose a system for testing ECC function of FPGA on-chip BRAM. The test of BRAM with ECC function can be realized by utilizing the internal logic of the FPGA and the data preset in the BRAM.

This significantly reduces the required test stimuli and the frequent interactions with the upper computer port, thereby greatly improving the test efficiency.

Embodiments of the present application disclose a system for testing ECC function of FPGA on-chip BRAM. In the system, multiple identical storage units are connected in series and simplify the logic of the self-test circuitry by utilizing the ECC logic of each BRAM to check each other; By utilizing FPGA on-chip resources to realize control logic, it is possible to avoid interacting with input/output ("I/O") ports during testing. This helps to circumvent the speed bottleneck due to parallel data passing through I/O. Extensive interaction with I/Os could consume a significant amount of I/O resources, and the substantial amount of data that the host machine needs to compare would occupy probes and memory, resulting in high spatial costs. Furthermore, this could lead to challenges in meeting timing constraints, making it difficult to increase speed, thereby incurring high temporal costs.

Figure 2:
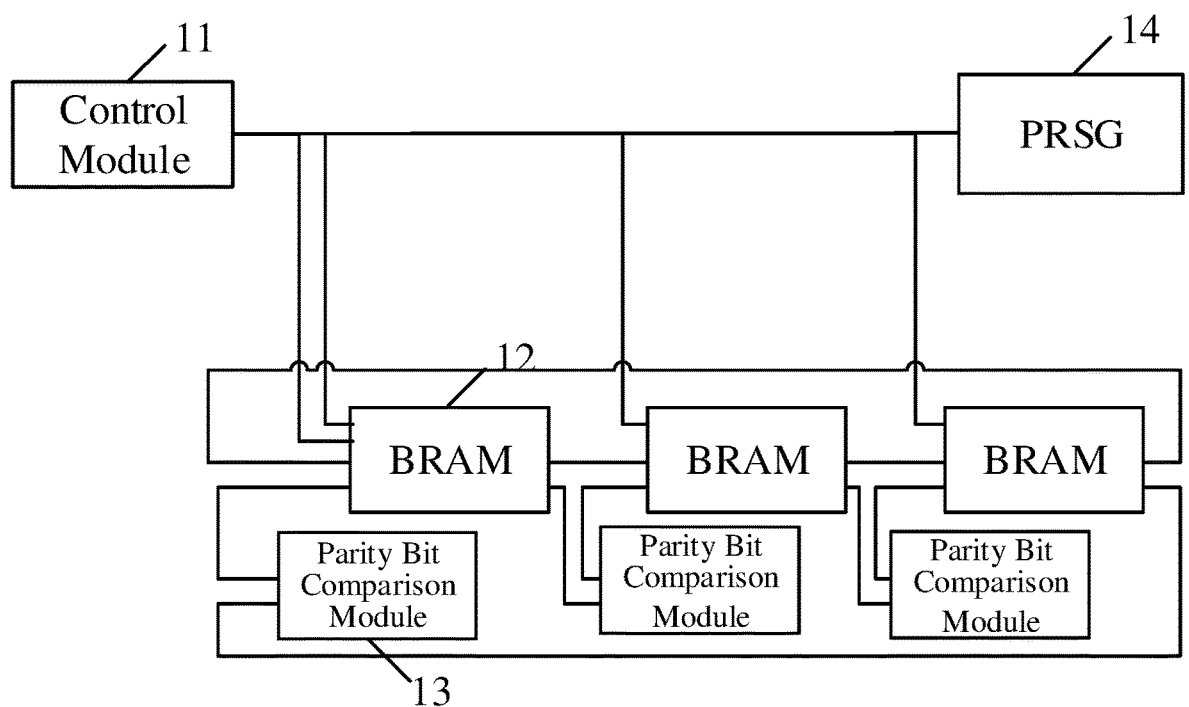
FIG. 2 is a block diagram illustrating a system capable of testing ECC Function of FPGA on-chip BRAM, having a PRSG.

An embodiment of the present application discloses a system for testing ECC function of FPGA on-chip BRAM, as shown in FIG. 2, including Pseudo Random Sequence Generator ("PRSG") 14; wherein the PRSG 14 is used to generate a test data sequence; wherein the number of data items in the test data sequence is not less than the total number of the memory addresses of all the BRAMs 12.

Each BRAM 12, is further used to store the processed test data sequence in reverse order according to the sequential memory address and the principle of each memory address storing one test data from the processed test data sequence, and then obtain the test data preset in the BRAM itself; wherein, the processed test data sequence includes: the test data sequence obtained by performing a one-bit flip process for each test data in the test data sequence, the next BRAM continues to store from the next test data adjacent to the last test data stored in the previous BRAM.

Each BRAM 12 writes the test data into the corresponding memory address of the next BRAM adjacent to the BRAM whenever the test data in the memory address is read, comprising: performing error correction process on the test data read and writing the error-corrected test data into the corresponding memory address in the next BRAM adjacent to the BRAM itself.

For example, the number of data items in the test data sequence generated by PRSG may be greater than or equal to the total sum of the memory addresses of all BRAMs. If the number of data items in the test data sequence generated by the PRSG is greater than the total sum of the memory addresses of all BRAMs, a part of test data sequence generated by the PRSG cannot be preset into the BRAM; and if the number of data items in the test data sequence generated by the PRSG is equal to the sum of the total number of memory addresses of all BRAMs, the test data sequence generated by the PRSG can exactly be preset into all BRAMs.

For example, the processed test data sequence is obtained by processing the test data sequence generated by PRSG through a preset method, i.e., by performing a one-bit flip process for each test data in the test data sequence.

For example, assuming that there are three BRAMs, and each BRAM has five memory addresses, then the number of data items in the test data sequence generated by PRSG should be 15. And continuing to assume that the PRSG generates the test data sequence as follows: 1 6 9 4 2 3 7 2 8 3 5 3 7 2 1, then the first BRAM stores the processed test data sequence in reverse order according to the sequential memory addresses. That is, the first memory address of the first BRAM stores the processed data "2", the second memory address of the first BRAM stores the processed data "7", the third memory address of the first BRAM stores the processed data "3", the fourth memory address of the first BRAM stores the processed data "5", the fifth memory address of the first BRAM stores processed data "3"; The second BRAM continues to store the test data "8", which is adjacent to the last test data "3" stored in the first BRAM. That is, the first memory address of the second BRAM stores the processed data "3", the second memory address of the second BRAM stores the processed data "8", the third memory address of the second BRAM stores the processed data "2", the fourth memory address of the second BRAM stores the processed data "7", the fifth memory address of the second BRAM stores the processed data "3"; The third BRAM continues to store the test data "2", which is adjacent to the last test data "3" stored in the second BRAM. That is, the first memory address of the third BRAM stores the processed data "2", the second memory address of the third BRAM stores the processed data "4", the third memory address of the third BRAM stores the processed data "9", the fourth memory address of the third BRAM stores the processed data "6", the fifth memory address of the third BRAM stores the processed data "1".

Figure 3:
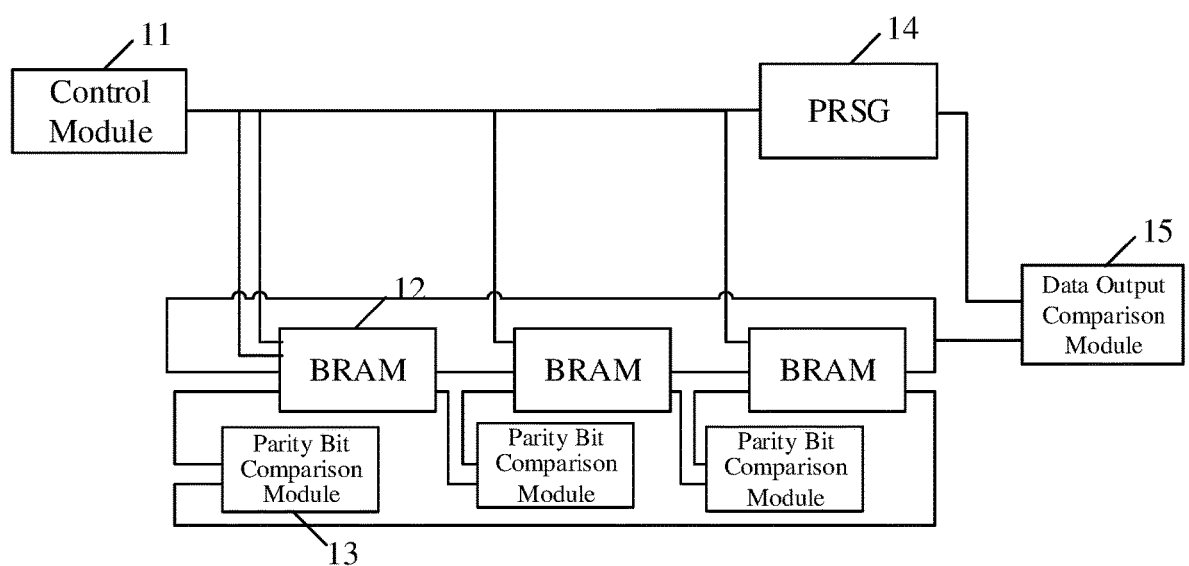
FIG. 3 is a block diagram illustrating a system capable of testing ECC Function of FPGA on-chip BRAM, having a PRSG and a data output comparison module.

An embodiment of the present application discloses a system for testing ECC function of FPGA on-chip BRAM, as shown in FIG. 3, including data output comparison module 15, which is connected to PRSG 14 and the last BRAM 12 in the at least two BRAMs, respectively.

The last BRAM 12 is further used to send the error-corrected test data to the data output comparison module whenever the test data of a memory address is read and is performed error correction process.

The data output comparison module 15 is further used to receive the test data sequence generated by PRSG 14 and the error-corrected test data from the last BRAM 12. Whenever an error-corrected test data is received, compare the corresponding test data in the test data sequence with the error-corrected test data received.

For example, in data output comparison module, the corresponding test data in the test data sequence is compared with the received test data which has performed error correction process, and the comparison result can be sent to the upper computer.

For example, the comparison of the test data sequence generated by PRSG with the error-corrected test data can check the error correction function of the error bits for BRAM.

In an exemplary embodiment, each BRAM sequentially reads test data preset in each memory address in the BRAM according to the data read and write test instruction, comprising: each BRAM sequentially reads test data preset in each memory address in the BRAM according to the data read and write test instruction until the test data in all the memory addresses in the first BRAM is rewritten back to all the memory addresses in the first BRAM.

For example, since the data output comparison module is set in the last BRAM, all the test data is considered to be checked, only when all the test data of all the memory addresses in the first BRAM is written back to all the addresses in the first BRAM. (Taking three BRAMs as an example, the specific process is that all the addresses in the first BRAM are written to all the addresses in the second BRAM, then to all the memory addresses in the third BRAM, and finally back to the first BRAM.)

Figure 4:
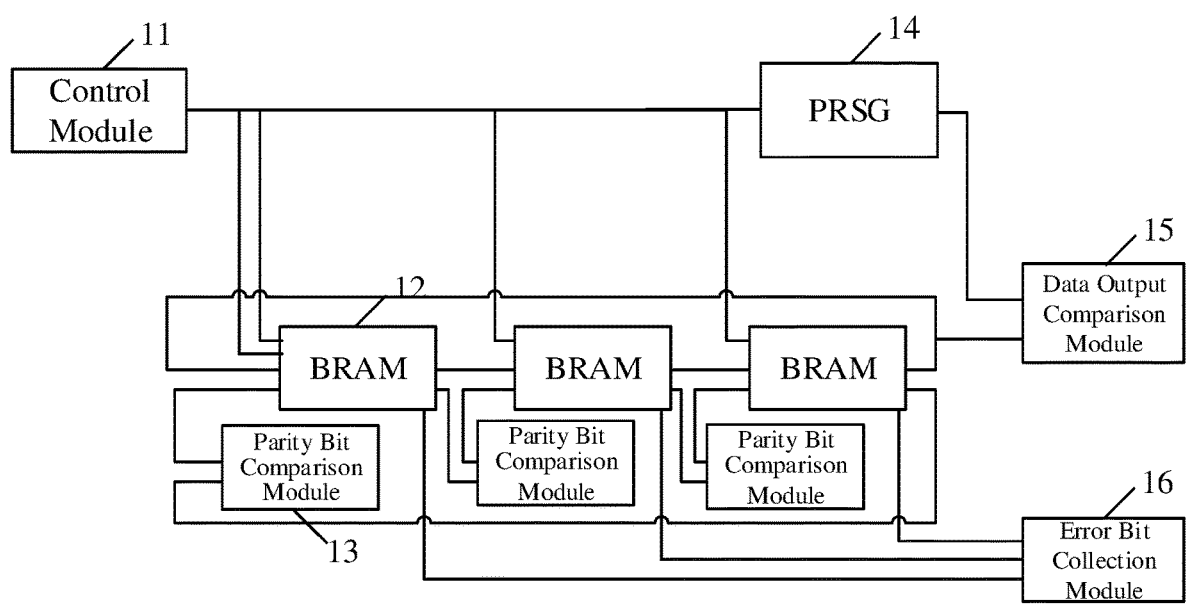
FIG. 4 is a block diagram illustrating a system capable of testing ECC Function of FPGA on-chip BRAM, having a PRSG, a data output comparison module, and an error bit collection module.

An embodiment of the present application discloses a system for testing ECC function of FPGA on-chip BRAM, as shown in FIG. 4, further including error bit collection module 16, which is connected to each BRAM 12.

Each BRAM 12 is further used to generate an error correction flag message and send the message to the error bit collection module 16 whenever one test data is performed error correction process.

The error bit collection module 16 is used to receive the error correction flag message from each BRAM 12 and send the message to the upper computer.

Figure 5:
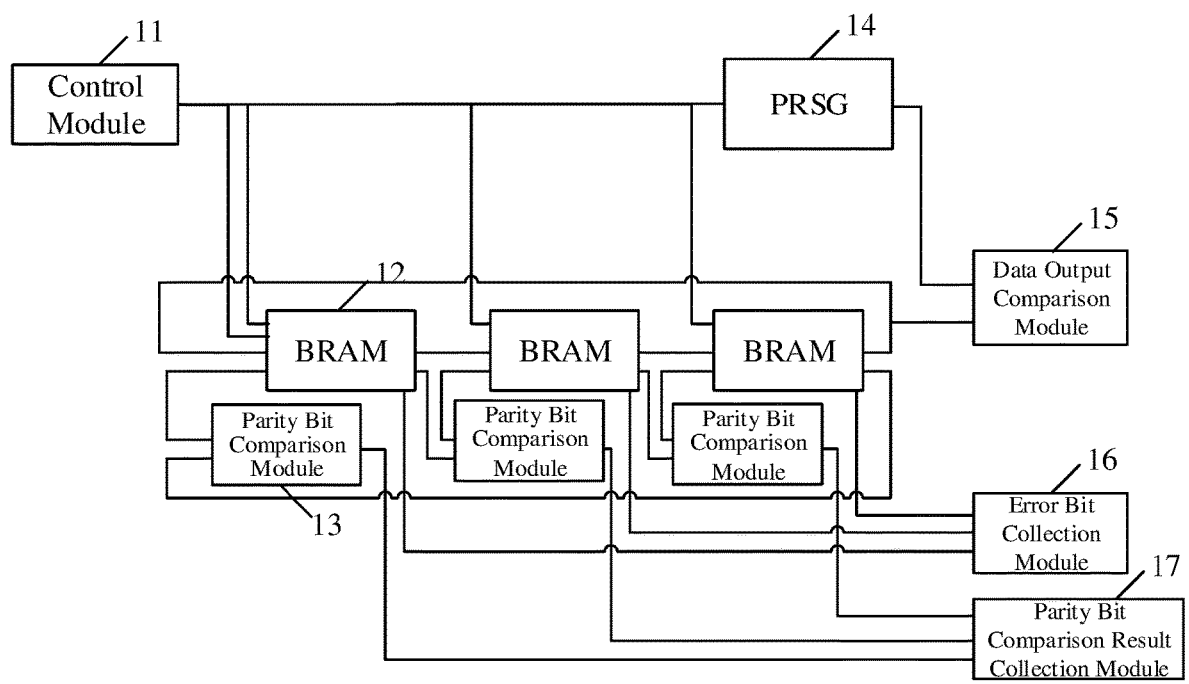
FIG. 5 is a block diagram illustrating a system capable of testing ECC Function of FPGA on-chip BRAM, having a PRSG, a data output comparison module, an error bit collection module, and a parity bit comparison result collection module.

An embodiment of the present application discloses a system for testing ECC function of FPGA on-chip BRAM, as shown in FIG. 5, further including parity bit comparison result collection module 17, which is connected to each parity bit comparison module 13;

Each parity bit comparison module 13 is further used to send the comparison result of the first parity bit from the corresponding BRAM 12 and the second parity bit from the next adjacent BRAM 12 to the parity bit comparison result collection module 17.

The parity bit comparison result collection module 17 is used to receive the comparison result from each parity bit comparison module 13 and send it to the upper computer.

In an exemplary embodiment, the control module 11, is further used to determine at least one information of first destination memory address of an error bit to be injected and send one-bit error injection instructions to the BRAM 12 to which each first destination memory address belongs; wherein each one-bit error injection instruction carries the information of the first destination memory address in the BRAM 12 to which it is sent; and further used to send data read and write instructions that carry the information of the first destination memory address in the BRAM 12 to the BRAM 12 to which each first destination memory address belongs.

Each BRAM 12 to which the information of the first destination memory address belongs is further used to flip one bit in the test data in the memory address corresponding to the information of the first destination memory address carried, in accordance with the one-bit error injection instruction; and is further used to read the test data in itself in the memory address corresponding to the information of the first destination memory address, in accordance with the data read and write instruction. Whenever the test data in a memory address is read and checked to contain a one-bit error, error correction process is performed on the test data read, and the error-corrected test data is written into the corresponding memory address in the next BRAM 12 adjacent to the BRAM 12 itself, and the first parity bit generated when the test data is read is sent to the parity bit comparison module corresponding to the BRAM 12 itself.

For example, the embodiment of the present application can test error injection function and one-bit error correction function in BRAM.

For example, control module may employ a random algorithm preset in itself to randomly determine, or read test information pre-written in itself to determine the information of at least one first destination memory address of the at least one error bit to be injected.

For example, in performing one-bit flip processing of the test data in the memory address corresponding to the information of the first destination memory address, each BRAM to which the information of the first destination memory address belongs may adopt a method of randomly selecting a bit to perform flip processing of the bit, and may also adopt a method of selecting a fixed bit to perform flip processing of the bit, i.e., each BRAM to which the information of the first destination memory address belongs selects a pre-specified bit (assumed to be the fifth bit) to perform flip processing of the bit.

In an exemplary embodiment, the control module 11, is further used to randomly determine at least one information of second destination memory address to which two error bits are to be injected and send two-bit error injection instructions to the BRAM 12 to which each second destination memory address belongs; wherein each two-bit error injection instruction carries the information of the second destination memory address in the BRAM 12 to which it is sent; and further used to send data read and write instructions that carry the information of the second destination memory address in the BRAM 12 to the BRAM 12 to which each second destination memory address belongs.

Each BRAM 12 to which the information of the second destination memory address belongs is further used to perform two-bit flip process in the test data in the memory address corresponding to the information of the second destination memory address carried, in accordance with the two-bit error injection instruction; and is further used to read the test data in itself in the memory address corresponding to the information of the second destination memory address, in accordance with the data read and write instruction. Whenever the test data in a memory address is read and checked to contain a two-bit error, the test data read is written into the corresponding memory address in the next BRAM 12 adjacent to the BRAM 12 itself, the first parity bit generated when the test data is read is sent to the parity bit comparison module corresponding to the BRAM 12 itself, and a message of finding a two-bit error during the error check and correction process is sent to the error bit collection module 16.

For example, embodiments of the present application can test error injection function and two-bit error check function in the BRAM. Since BRAM cannot check the two-bit error, so this time the first parity bit generated when the data is read and the second parity bit generated when the data is written to the next BRAM are bound to be different, then the BRAM will send the message of finding a two-bit error during the check process to the error bit collection module, and this completes the two-bit error check function.

In an exemplary embodiment, the comparison result includes identification information of indicating whether the results generated through the comparison are consistent.

Figure 6:
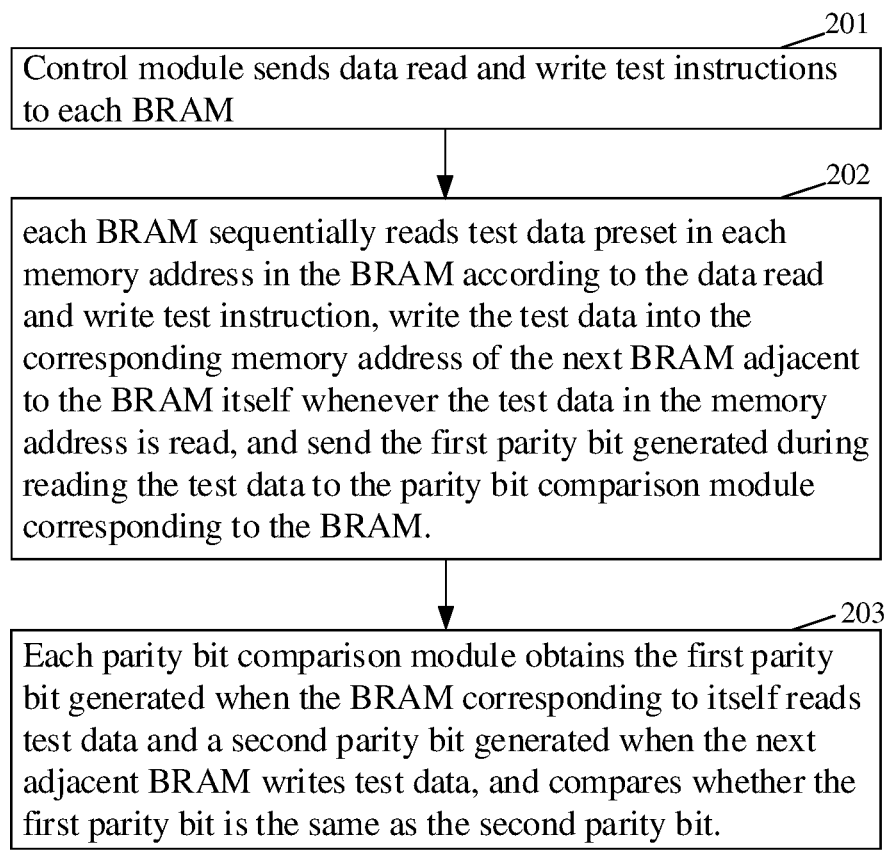
FIG. 6 is a flowchart illustrating a method capable of testing ECC Function of FPGA on-chip BRAM.

Embodiments of the present application further discloses a method for testing ECC function of FPGA on-chip BRAM, which is applied to the system for testing ECC function of FPGA on-chip BRAM described in any of the above embodiments, as shown in FIG. 6, comprising following steps.

At block 201, control module sends data read and write test instructions to each BRAM.

At block 202, each BRAM sequentially reads test data preset in each memory address in the BRAM according to the data read and write test instruction, write the test data into the corresponding memory address of the next BRAM adjacent to the BRAM itself whenever the test data in the memory address is read, and send the first parity bit generated during reading the test data to the parity bit comparison module corresponding to the BRAM.

At block 203, each parity bit comparison module obtains the first parity bit generated when the BRAM corresponding to itself reads test data and a second parity bit generated when the next adjacent BRAM writes test data, and compares whether the first parity bit is the same as the second parity bit.

In an exemplary embodiment, the system for testing ECC function of FPGA on-chip BRAM further includes PRSG, wherein the number of data items in the test data sequence is not less than the total number of the memory addresses of all the BRAMs.

An embodiment of the present application discloses a system for testing ECC function of FPGA on-chip BRAM, further comprising:

Each BRAM stores the processed test data sequence in reverse order according to the sequential memory address and the principle of each memory address storing one test data from the processed test data sequence, and then obtain the test data preset in the BRAM itself; wherein, the processed test data sequence includes: the test data sequence obtained by performing a one-bit flip process for each test data in the test data sequence, the next BRAM continues to store from the next test data adjacent to the last test data stored in the previous BRAM.

In an exemplary embodiment, each BRAM writes the test data into the corresponding memory address of the next BRAM adjacent to the BRAM whenever the test data in the memory address is read, comprising: performing error correction process on the test data read and writing the error-corrected test data into the corresponding memory address in the next BRAM adjacent to the BRAM itself.

In an exemplary embodiment, the system for testing ECC function of FPGA on-chip BRAM further includes data output comparison module, which is connected to PRSG and the last BRAM in the at least two BRAMs, respectively.

An embodiment of the present application discloses a method for testing ECC function of FPGA on-chip BRAM, further comprising: Firstly, the last BRAM sends the error-corrected test data to the data output comparison module whenever the test data of a memory address is read and is performed error correction process; and Secondly, the data output comparison module receives the test data sequence generated by PRSG and the error-corrected test data from the last BRAM. Whenever an error-corrected test data is received, compare the corresponding test data in the test data sequence with the error-corrected test data received.

In an exemplary embodiment, each BRAM sequentially reads test data preset in each memory address in the BRAM according to the data read and write test instruction, comprising each BRAM sequentially reads test data preset in each memory address in the BRAM according to the data read and write test instruction until the test data in all the memory addresses in the first BRAM is rewritten back to all the memory addresses in the first BRAM.

In an exemplary embodiment, the system for testing ECC function of FPGA on-chip BRAM further includes error bit collection module, which is connected to each BRAM.

An embodiment of the present application discloses a method for testing ECC function of FPGA on-chip BRAM, further comprising: Firstly, each BRAM generates an error correction flag message and send the message to the error bit collection module whenever one test data is performed error correction process; and Secondly, the error bit collection module receives the error correction flag message from each BRAM and send the message to the upper computer.

In an exemplary embodiment, the system for testing ECC function of FPGA on-chip BRAM further includes parity bit comparison result collection module, which is connected to each parity bit comparison module.

An embodiment of the present application discloses a method for testing ECC function of FPGA on-chip BRAM, further comprising: Firstly, each parity bit comparison module sends the comparison result of the first parity bit from the corresponding BRAM and the second parity bit from the next adjacent BRAM to the parity bit comparison result collection module; and Secondly, the parity bit comparison result collection module is used to receive the comparison result from each parity bit comparison module and send it to the upper computer.

An embodiment of the present application discloses a method for testing ECC function of FPGA on-chip BRAM, further comprising: Firstly, control module determines at least one information of first destination memory address of an error bit to be injected and send one-bit error injection instructions to the BRAM to which each first destination memory address belongs; wherein each one-bit error injection instruction carries the information of the first destination memory address; Secondly, each BRAM to which the information of the first destination memory address belongs flips one bit in the test data in the memory address corresponding to the information of the first destination memory address carried, in accordance with the one-bit error injection instruction; Thirdly, the control module sends the data read and write instruction carried the information about the first destination memory address in the BRAM to each BRAM to which the first destination memory address belongs; and Next, each BRAM to which the information of the first destination memory address belongs reads the test data in itself in the memory address corresponding to the information of the first destination memory address, in accordance with the data read and write instruction. Whenever the test data in a memory address is read and checked to contain a one-bit error, error correction process is performed on the test data read, and the error-corrected test data is written into the corresponding memory address in the next BRAM adjacent to the BRAM itself, and the first parity bit generated when the test data is read is sent to the parity bit comparison module corresponding to the BRAM itself.

Finally, parity bit comparison module obtains the first parity bit generated when the BRAM to which the first destination memory address belongs corresponding to itself reads test data and a second parity bit generated when the next adjacent BRAM writes test data, compares whether the first parity bit is the same as the second parity bit, and sends the comparison result to the parity bit comparison result collection module.

An embodiment of the present application discloses a method for testing ECC function of FPGA on-chip BRAM, comprising: Firstly, the control module randomly determines at least one information of second destination memory address of an error bit to be injected and sends two-bit error injection instructions to the BRAM to which each second destination memory address belongs; wherein each two-bit error injection instruction carries the information of the second destination memory address; Secondly, each BRAM to which the information of the second destination memory address belongs flips two bits in the test data in the memory address corresponding to the information of the second destination memory address carried, in accordance with the two-bit error injection instruction; Thirdly, the control module sends the data read and write instruction carried the information about the second destination memory address in the BRAM to each BRAM to which the second destination memory address belongs; Next, each BRAM to which the information of the second destination memory address belongs reads the test data in itself in the memory address corresponding to the information of the second destination memory address, in accordance with the data read and write instruction. Whenever the test data in a memory address is read and checked to contain a two-bit error, the test data read is written into the corresponding memory address in the next BRAM adjacent to the BRAM itself, and the first parity bit generated when the test data is read is sent to the parity bit comparison module corresponding to the BRAM itself. The parity bit comparison module sends the message of finding a two-bit error during the check process to the error bit collection module; and Finally, parity bit comparison module obtains the first parity bit generated when the BRAM to which the second destination memory address belongs corresponding to itself reads test data and a second parity bit generated when the next adjacent BRAM writes test data, compares whether the first parity bit is the same as the second parity bit, and sends the comparison result to the parity bit comparison result collection module. Error bit collection module sends the message of finding a two-bit error to the upper computer.

In an exemplary embodiment, the comparison result includes identification information of indicating whether the results generated through the comparison are consistent.

Embodiments of the present application disclose a method for testing ECC function of FPGA on-chip BRAM. The test of BRAM with ECC function can be realized by utilizing the internal logic of the FPGA and the data preset in the BRAM. This significantly reduces the required test stimuli and the frequent interactions with the upper computer port, thereby greatly improving the test efficiency.

Embodiments of the present application disclose a method for testing ECC function of FPGA on-chip BRAM. In the system, multiple identical storage units are connected in series and simplify the logic of the self-test circuitry by utilizing the ECC logic of each BRAM to check each other; By utilizing FPGA on-chip resources to realize control logic, it is possible to avoid interacting with I/O ports during testing. This helps to circumvent the speed bottleneck due to parallel data passing through I/O.

Those of ordinary skills in the art will recognize that some or all of the steps, systems, and functional modules/units in the devices disclosed above may be implemented as software, firmware, hardware, and suitable combinations thereof. In hardware implementations, the division between functional modules/units referred to in the above description does not necessarily correspond to the division of physical components; for example, a physical component may have more than one function, or a function/step may be cooperatively performed by several physical components. Some or all of the components may be implemented as software executed by a processor, such as a digital signal processor or microprocessor, or as hardware, or as an IC, such as ASIC. Such software may be distributed on computer-readable media, including computer storage media (or non-volatile media) and communication media (or non-volatile media). Those of ordinary skills in the art will recognize that the term computer storage medium includes volatile, non-volatile, removable, and non-removable media implemented in any method or technique for storing information, such as computer-readable instructions, data structures, program modules or other data. The computer storage media include, but not limited to, RAM, ROM, electrically erasable programmable read-only memory ("EEPROM"), flash memory or other memory technology, compact disc read-only memory (CD-ROM), Digital Versatile Disc (DVD), or other optical disc storage, magnetic disk, magnetic tape, magnetic disk storage, or any other media capable of storing desired information and accessible by a computer. In addition, those of ordinary skills in the art will recognize that the communication medium typically contains computer-readable instructions, data structures, program modules, or other data in a modulated data signal such as a carrier wave or other transmission mechanism, and any information delivery medium.

What is claimed is:

1. A system for testing Error Correcting Code ("ECC") function of Field Programmable Gate Array ("FPGA") on-chip block random access memory ("BRAM"), comprising:
   a set on a programmable array logic in the FPGA;
   one or more control modules coupled to the FPGA;
   at least two BRAMs with ECC function; and
   one or more parity bit comparison modules corresponding to each of the BRAMs, wherein the at least two BRAMs are sequentially connected to form a ring connection structure, wherein each parity bit comparison module is connected to its corresponding BRAM and next adjacent BRAM; wherein, the control module is configured to send data read and write test instructions to each BRAM,
   wherein each BRAM is configured to sequentially read test data preset in each memory address in the BRAM according to the data read and write test instruction, write the test data into the corresponding memory address of the next BRAM adjacent to the BRAM itself whenever the test data in the memory address is read, and send the first parity bit generated during reading the test data to the parity bit comparison module corresponding to the BRAM, and
   wherein each parity bit comparison module is used to obtain the first parity bit generated when the BRAM corresponding to itself reads test data and a second parity bit generated when the next adjacent BRAM writes test data, and compares whether the first parity bit is the same as the second parity bit.

2. The system of claim 1, further comprising a Pseudo Random Sequence Generator (PRSG), wherein the PRSG is configured to generate a test data sequence; wherein the number of data items in the test data sequence is not less than the total number of the memory addresses of all the BRAMs;
   wherein each BRAM is further used to store the processed test data sequence in reverse order according to the sequential memory address and the principle of each memory address storing one test data from the processed test data sequence, and then obtain the test data preset in the BRAM itself; wherein, the processed test data sequence includes: the test data sequence obtained from the one-bit flipping of each test data in the test data sequence, the next BRAM continues to store from the next test data adjacent to the last test data stored in the previous BRAM;
   wherein each BRAM writes the test data into the corresponding memory address of the next BRAM adjacent to the BRAM whenever the test data in the memory address is read for performing error correction process on the test data read and writing the error-corrected test data into the corresponding memory address in the next BRAM adjacent to the BRAM itself.

3. The system of claim 2, further comprising a data output comparison module coupled to the PRSG and the last BRAM in the at least two BRAMs, wherein the last BRAM sends the error-corrected test data to the data output comparison module whenever the test data of a memory address is read and is performed error correction process, wherein the data output comparison module receives the test data sequence generated by PRSG and the error-corrected test data from the last BRAM, whenever an error-corrected test data is received, compare the corresponding test data in the test data sequence with the error-corrected test data received.

4. The system of claim 3, wherein each BRAM sequentially reads test data preset in each memory address in the BRAM according to the data read and write test instruction, wherein each BRAM sequentially reads test data preset in each memory address in the BRAM according to the data read and write test instruction until the test data in all the memory addresses in the first BRAM is rewritten back to all the memory addresses in the first BRAM.

5. The system of claim 3, wherein the comparison result comprising identification information of indicating whether the results generated through the comparison are consistent.

6. The system for testing ECC function of FPGA on-chip BRAM applied to the system for testing ECC function of FPGA on-chip BRAM as claimed in any one of claim 5, comprising:
control module sends data read and write test instructions to each BRAM;
each BRAM sequentially reads test data preset in each memory address in the BRAM according to the data read and write test instruction, write the test data into the corresponding memory address of the next BRAM adjacent to the BRAM itself whenever the test data in the memory address is read, and send the first parity bit generated during reading the test data to the parity bit comparison module corresponding to the BRAM; and
each parity bit comparison module obtains the first parity bit generated when the BRAM corresponding to itself reads test data and a second parity bit generated when the next adjacent BRAM writes test data, and compares whether the first parity bit is the same as the second parity bit.

7. The system of claim 5, wherein the comparison result comprising identification information of indicating whether the results generated through the comparison are consistent.

8. The system of claim 2, further comprising error bit collection modules connected to each BRAM, wherein each BRAM is configured to generate an error correction flag message and send the message to the error bit collection module whenever one test data is performed error correction process, wherein the error bit collection module is used to receive the error correction flag message from each BRAM and send the message to the upper computer.

9. The system of claim 2, further comprising parity bit comparison collection modules connected to each parity bit comparison module, wherein each parity bit comparison module is configured to send the comparison result of the first parity bit from the corresponding BRAM and the second parity bit from the next adjacent BRAM to the parity bit comparison result collection module, wherein the parity bit comparison result collection module is used to receive the comparison result from each parity bit comparison module and send it to the upper computer.

10. The system of claim 1, wherein the control module is further used to determine at least one information of first destination memory address of an error bit to be injected and send one-bit error injection instructions to the BRAM to which each first destination memory address belongs; wherein each one-bit error injection instruction carries the information of the first destination memory address in the BRAM to which it is sent; and further used to send data read and write instructions that carry the information of the first destination memory address in the BRAM to the BRAM to which each first destination memory address belongs, wherein each BRAM is further configured to flip one bit in the test data in the memory address corresponding to the information of the first destination memory address carried, in accordance with the one-bit error injection instruction; and is further used to read the test data in itself in the memory address corresponding to the information of the first destination memory address, in accordance with the data read and write instruction, whenever the test data in a memory address is read and checked to contain a one-bit error, error correction process is performed on the test data read, and the error-corrected test data is written into the corresponding memory address in the next BRAM adjacent to the BRAM itself, and the first parity bit generated when the test data is read is sent to the parity bit comparison module corresponding to the BRAM itself.

11. The system of claim 1, wherein the control module is configured to randomly determine at least one information of second destination memory address to which two error bits are to be injected and send two-bit error injection instructions to the BRAM to which each second destination memory address belongs; wherein each two-bit error injection instruction carries the information of the second destination memory address in the BRAM to which it is sent; and further used to send data read and write instructions that carry the information of the second destination memory address in the BRAM to the BRAM to which each second destination memory address belongs, wherein each BRAM is configured to perform two-bit flip process in the test data in the memory address corresponding to the information of the second destination memory address carried, in accordance with the two-bit error injection instruction; and is further used to read the test data in itself in the memory address corresponding to the information of the second destination memory address, in accordance with the data read and write instruction, whenever the test data in a memory address is read and checked to contain a two-bit error, the test data read is written into the corresponding memory address in the next BRAM adjacent to the BRAM itself, the first parity bit generated when the test data is read is sent to the parity bit comparison module corresponding to the BRAM itself, and a message of finding a two-bit error during the check process is sent to the error bit collection module.

12. The system for testing ECC function of FPGA on-chip BRAM applied to the system for testing ECC function of FPGA on-chip BRAM as claimed in any one of claim 1, comprising:
control module sends data read and write test instructions to each BRAM;
each BRAM sequentially reads test data preset in each memory address in the BRAM according to the data read and write test instruction, write the test data into the corresponding memory address of the next BRAM adjacent to the BRAM itself whenever the test data in the memory address is read, and send the first parity bit generated during reading the test data to the parity bit comparison module corresponding to the BRAM; and
each parity bit comparison module obtains the first parity bit generated when the BRAM corresponding to itself reads test data and a second parity bit generated when the next adjacent BRAM writes test data, and compares whether the first parity bit is the same as the second parity bit.

* * * * *